United States Patent
Murakami et al.

(10) Patent No.: US 6,356,341 B1
(45) Date of Patent: Mar. 12, 2002

(54) EXPOSURE DEVICE, BEAM SHAPE SETTING DEVICE AND ILLUMINATING AREA SETTING DEVICE

(75) Inventors: Masaichi Murakami; Norimi Takemura; Noritsugu Hanazaki, all of Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/334,260

(22) Filed: Jun. 16, 1999

(30) Foreign Application Priority Data

Jun. 18, 1998 (JP) .......................................... 10-171322
Jul. 9, 1998 (JP) .......................................... 10-194647

(51) Int. Cl.⁷ ...................... G03B 27/54; G03B 27/32; G03C 5/00
(52) U.S. Cl. ............................ 355/67; 355/77; 430/311
(58) Field of Search .................... 355/53, 55, 67–71, 355/77; 356/399–401, 237.2, 363; 250/548, 461.1, 459.1; 430/311

(56) References Cited

U.S. PATENT DOCUMENTS 5,486,896 A  *  1/1996  Hazama et al. ............... 355/71
5,767,949 A  *  6/1998  Noguchi et al. .............. 355/67
6,213,607 B1 *  4/2001  Watanabe et al. ........... 359/601

FOREIGN PATENT DOCUMENTS

JP   B-5-32900     5/1993
JP   A-7-235466    9/1995

* cited by examiner

Primary Examiner—Russell Adams
Assistant Examiner—Henry Hung Nguyen
(74) Attorney, Agent, or Firm—Oliff & Berridge, PLC

(57) ABSTRACT

The present invention has an objective to prevent images of particles from being transferred onto a photosensitive substrate, so in order to achieve such an objective, an exposure device of the present invention, which has an illumination optical system for illuminating a reticle having a pattern with a beam from an illumination source so that the pattern is formed on the substrate on exposure to light, is equipped with illuminating area setting means, which are arranged at two locations within the illumination optical system so as to set an illuminating area of the beam illuminating the reticle, and an optical system which places the illuminating area setting means being conjugate to the reticle.

7 Claims, 6 Drawing Sheets

EXPOSURE DEVICE, BEAM SHAPE SETTING DEVICE AND ILLUMINATING AREA SETTING DEVICE

BACKGROUND OF THE INVENTION

1. Field of the Invention

The present invention relates to exposure devices which are used for manufacturing of semiconductor components and liquid crystal display substrates, for example, by projecting patterns of reticles, to which light sources radiate beams by illuminating area setting means, on photosensitive substrates, and particularly relates to exposure devices, used to perform so-called screen composition in which parts of patterns overlap each other on the photosensitive substrates to form patterns of large areas, as well as devices usable for the exposure devices such as beam shape setting devices, which adjust shapes of beams from illumination sources, and illuminating area setting devices.

2. Background Art

Conventionally, in order to cope with enlargement of the photosensitive substrates which serve as exposed objects, the exposure device of this kind employs a method of screen composition in which an overall exposed area of the photosensitive substrate is divided into multiple unit areas and exposure is repeated in response to each of the unit areas so that desired patterns are formed. In order to perform the screen composition, exposure is performed on exposed areas whose boundaries slightly overlap each other in order to prevent gaps from being formed at boundary positions of the exposed areas due to formation errors of reticles used for pattern projection, aberrations of optical lenses for projection, and errors in positioning of stages used for positioning of the photosensitive substrates.

In general, adjustment of the aforementioned illuminating areas is performed such that reticle blinds are arranged at substantially conjugate positions of the reticles within an optical system of illumination illuminating the reticles. The reticle blind of this kind corresponds to opposed arrangement of units (hereinafter, referred to as blind blades) having two reference sides which are made of metal materials crossing each other, so that openings are set in positions and sizes, that is, illuminating areas are set by moving the blind blades in X-Y directions that cross an optical axis.

However, if such reticle blinds are used and are simply overlapped with the exposed areas, exposure values are doubled with respect to overlapped portions, so some characteristic of photosensitizer may causes variations in line widths of patterns at their joint portions. In addition, when the screen composition is performed, differences in level are caused to occur at the joint portions of the patterns due to positional gaps between the adjoining exposed areas, which may damage characteristics of devices.

In the case where different exposure devices share steps of multilayer composition using patterns of a single layer formed by screen composition with respect to multiple layers respectively, overlapping errors in overlapping the exposed areas of the layers vary discontinuously at joint portions of the patterns due to lens aberrations and positioning accuracy of the exposure devices, wherein particularly in active-matrix liquid crystal display devices, contrasts vary discontinuously at the joint portions of the patterns, so qualities of the devices will be deteriorated.

Therefore, in order to eliminate the aforementioned disadvantages in the screen composition, an exposure device disclosed by Japanese Patent Application, First Publication No. Hei 7-235466 is proposed. In this exposure device, there is arranged a reticle blind 5, which is formed by overlapping two sheets of blinds 5A, 5B as shown in FIG. 10A at optically conjugate positions with respect to the reticle, wherein it is possible to obtain a pattern of a necessary extinction area by matching openings 23, 25 of the blinds 5A, 5B together, further, it is possible to match an irradiation range of illumination light with a size of the reticle by changing sizes of the openings, which is actualized by changing relative positions of the blinds 5A, 5B.

The reticle blind 5 is formed by arranging the blinds 5A, 5B, each of which has two openings and whose chrome surfaces face with each other, in proximity to each other in an order of 100 $\mu$m. In addition, each of the blinds 5A, 5B is formed by vapor deposition in which chrome is deposited on a transparent glass substrate and is equipped with a shade portion 21 for shade of illumination light, extinction portions 22, 24 for attenuation of transmission factors of illumination light and openings 23, 25 on which chrome is not deposited.

In the extinction portions 22, 24, a chrome film corresponds to dots, each of which is smaller than a resolution limit of the exposure device, and are deposited on the glass substrate, wherein a density of the dots of the chrome film is increased in a direction from the opening 23 to the shade portion 21 (or from the opening 25 to the shade portion 21) so that an extinction factor is changed with respect to the extinction portion 22 or 24. FIG. 10B and FIG. 10C show extinction characteristics with respect to one blind 5A or 5B of the reticle blind 5. By overlapping adjoining exposed areas in the extinction portions 22, 24, the joint portions of the patterns change smoothly.

However, the aforementioned reticle blind 5 requires the transparent substrate like the glass as the base for formation of the extinction portions 22, 24, so if particles whose diameters are greater than a certain diameter are adhered to the glass substrate of the reticle blind 5 at its openings 23, 25 or extinction portions 22, 24, there is a problem that the particles originally adhered on the glass substrate of the reticle blind 5 are transferred to the photosensitive substrate because the reticle blind 5, reticle and photosensitive substrate are arranged at optically conjugate positions.

For this reason, the conventional device is equipped with a particle detector which detects adhesion of the particles by projecting detection light such as mercury light on Cr-deposited surfaces and measuring amounts of scattering light which occurs, so the construction of the device must be complicated.

In addition, the aforementioned particle detector is capable of performing detection on a front surface of a glass plate but is hard to project the detection light on a back of the glass plate due to construction thereof, so it is actually incapable of detecting existence of foreign matters to be existed on the back of the glass plate.

SUMMARY OF THE INVENTION

The present invention is made in consideration of the aforementioned problems, and it is an object of the invention to provide an exposure device, which is capable of preventing particles from being transferred to a photosensitive substrate and which does not require a particle detector, as well as a beam shape setting device used for the exposure device.

In order to achieve the aforementioned object, an exposure device of the present invention, which has an illumination optical system for illuminating a reticle having a pattern with a beam from an illumination source so that the pattern is formed on a substrate on exposure to light, is equipped with illuminating area setting means, which are arranged at two locations in the illumination optical system so as to set an illuminating area of the beam illuminating the reticle, and an optical system which places the illuminating area setting means being conjugate to the reticle.

In addition, a beam shape setting device of the present invention, which has a transmission portion for transmitting a beam therethrough and a shade portion for shade of the beam so as to set a shape of the beam, is equipped with a protection member which covers the transmission portion with a material that transmits the beam.

The beam shape setting device of the present invention can be equipped with an extinction portion, which is arranged in at least a part of an area between the transmission portion and the shade portion and which reduces a transmission factor of the beam to be smaller in a direction from the transmission portion to the shade portion. In this case, it is possible to smoothly connect joints of patterns of screen composition.

In this case, it is possible to provide a transparent base material, so the shade portion is formed by a shade member mounted on the transparent base material, the transmission portion is formed by an opening formed on the transparent base material, and the extinction portion is formed such that a density of the shade member on the transparent base material is increased to be larger in a direction from the transmission portion to the shade portion. In this case, it is possible to form the transmission portion and extinction portion with simple constructions.

In addition, the exposure device of the present invention can use the beam shape setting device as the illuminating area setting means.

In addition, the illuminating area setting device of the present invention is the illuminating area setting device which sets an illuminating area of the beam by using a shade portion for shade of at least a part of the beam in a side of a front surface of the transmitting portion for transmitting the beam therethrough and which is equipped with a cover plate which transmits the beam and which forms a closed space corresponding to a predetermined space in a side of a back surface of the transmission portion.

Therefore, the illuminating area setting device of the present invention is capable of setting an illuminating area of the beam by using the shade portion with respect to the beam which transmits through the transmission portion and cover plate. The cover plate forms the closed space in the side of the back surface of the transmission portion, so it is possible to prevent foreign matters from being attached to the transmission portion.

Thus, the illuminating area setting device is capable of preventing the foreign matters from being attached to the back surface of the transmission portion, while the cleaning operation is required with respect to only the front surface to which the foreign matters are being attached, so it is possible to obtain an effect in reduction of the maintenance time.

The illuminating area setting device can be constructed such that the closed space is formed by a holding member for holding the back surface of the transmission portion and the cover plate. In this case, it is possible to form the closed space in the side of the back surface of the transmission portion with ease by merely providing the cover plate, which offers effects in preventing the foreign matters from being attached to the back surface of the transmission portion and in reduction of the maintenance time.

The illuminating area setting device can be constructed such that cover plates are arranged with respect to multiple transmission portions respectively. In this case, even if there are arranged multiple transmission portions, it is possible to obtain a superior effect in preventing the foreign matters from being attached to the back surfaces of the transmission portions respectively.

An exposure device of another embodiment of the present invention is the exposure device in which a light source radiates a beam on a reticle by an illuminating area setting device so that a pattern of the reticle being illuminated is transferred to a photosensitive substrate, wherein it is characterized by that as the illuminating area setting device, the aforementioned illuminating area setting is used such that the front surface of the transmission portion is located in proximity to a conjugate plane of the reticle, so that an illuminating area of the beam being radiated to the reticle is set by the illuminating area setting device.

In this exposure device, a closed space is formed in a side of a back surface of the transmission portion, so that it is possible to prevent foreign matters from being attached to the back surface of the transmission portion, and it is possible to prevent images of the foreign matters from being transferred onto the photosensitive substrate. In the case where the foreign matters are attached to the back surface of the transmission portion, they are attached to the cover plate as well, however, the cover plate is arranged being apart from the conjugate plane of the reticle by a distance corresponding to the closed space, so it is possible to prevent images of the foreign matters from being formed on the photosensitive substrate.

Therefore, the foreign matters are not attached to both of the surfaces of the transmission portion, so it is possible to obtain an effect that a pattern of the reticle can be certainly transformed onto the photosensitive substrate in accordance with prescribed procedures. Even if the foreign matters are attached to the cover plate, it is possible to avoid nonuniformity of illuminance, which causes a problem with respect to the photosensitive substrate, and it is possible to prevent images of the foreign matters from being transferred onto the photosensitive substrate, wherein even if parameters constructing the optical characteristics are changed, it is possible to obtain an effect in adequately setting a separation distance between the conjugate plane of the reticle and the cover plate on the basis of expected sizes of the foreign matters.

The exposure device of the present invention can be equipped with a foreign matter inspection device for performing detection as to whether foreign matters are attached to the surface of the transmission portion or not. Thus, the exposure device is capable of performing detection on the front surface of the transmission portion in which the foreign matters are not attached to the back surface, so during an exposure mode, it is possible to perform the setting of the illuminating area under conditions where no foreign matters are attached to both of the front and back surfaces of the transmission portion, so it is possible to obtain a superior effect in accuracy of transferring the predetermined pattern formed on the reticle to the photosensitive substrate.

PREFERRED EMBODIMENT

Hereinafter, the preferred embodiment of the present invention will be described in detail with reference to the drawings.

[Embodiment 1]

Figure 1:
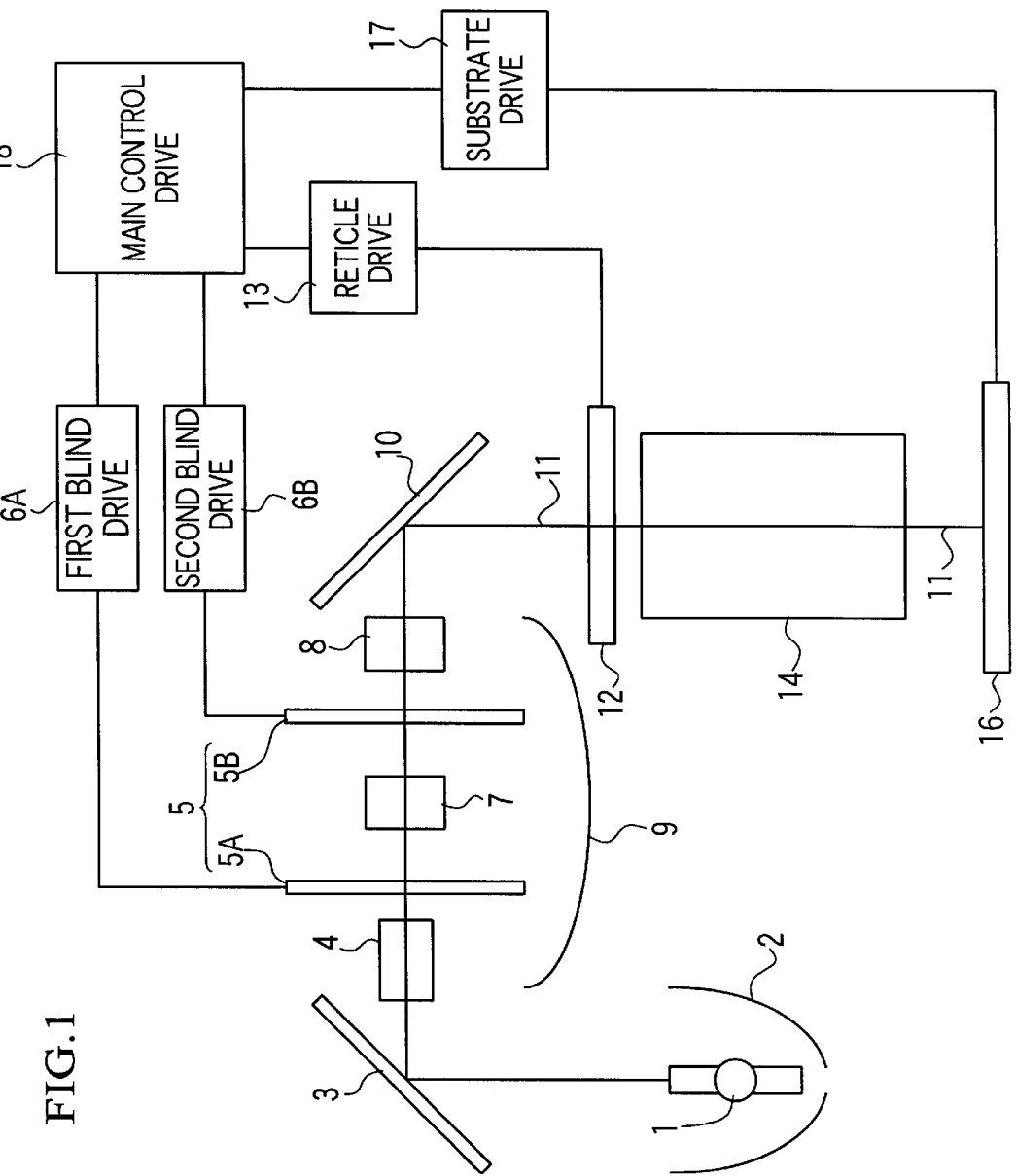
FIG. 1 is a schematic block diagram showing an outline of embodiment 1 of the present invention.

FIG. 1 is a schematic block diagram showing an outline of an exposure device of embodiment 1 according to the present invention. Exposure light 11 of an extra-high pressure mercury lamp 1 which serves as an exposure light source is converged on an elliptical mirror 2 and is reflected by a reflection mirror 3, then, it is incident on a fly-eye integrator 4. The fly-eye integrator 4 converts illuminating light 11 to luminous flux of uniform illuminance distribution, so the illuminating light 11 transmitting through the fly-eye integrator 4 reaches a first blind 5A. The first blind 5A is capable of moving within a plane by a first blind drive 6A. The illuminating light transmitting through the first blind 5A is incident on a first relay lens system 7, by which an image of an opening of the first blind 5A is formed on a second blind 5B. The second blind 5B is capable of moving within a plane by a second blind drive 6B.

Images of openings of the first blind 5A and second blind 5B are further formed on a reticle 12 via a reflection mirror 10 by a second relay lens system 8. Within an illumination optical system 9 which is constructed by the fly-eye integrator 4, first blind 5A, first relay lens system 7, second blind 5B and second relay lens system 8, there are provided two locations, which are arranged as being optically conjugate with the reticle 12 and at which the first blind 5A and second blind 5B are arranged so that the illuminating light 11 illuminates a desired area of the reticle 12 by the openings of the first blind 5A and second blind 5B.

The reticle 12 is adjusted in position within a horizontal plane by a reticle drive 13. An image of a pattern which exists in an illuminating area of the reticle 12 is formed on a photosensitive substrate 16 by a projection lens 14, so a specific area of the photosensitive substrate 16 is exposed to the exposure light 11 in accordance with the pattern of the reticle 12. The photosensitive substrate 16 corresponds to a wafer in case of the manufacturing process of the semiconductor integrated circuit, while it corresponds to a rectangular glass plate in case of the manufacturing process of the liquid crystal display.

The photosensitive substrate 16 is driven within a horizontal plane and is adjusted in position by a substrate drive 17. Operations of the first blind drive 6A, second blind drive 6B, reticle drive 13 and substrate drive 17 are controlled by a main control device 18. When the screen composition is performed, the operations are controlled by the main control device 18, so after first exposure is completed, the reticle 12 is replaced with a new one, a combination of overlapping the extinction portions 22, 24 of the first blind 5A and second blind 5B is changed to a desired combination by the first blind drive 6A and second blind drive 6B so that an opening of the reticle blind 5 is adjusted in size, while the substrate drive 17 drives the photosensitive substrate 16 to set another location as a next exposure area, which is exposed to light. Thereafter, every time the exposure is completed, similar procedures are repeated so that an overall area of the photosensitive substrate 16 is exposed to light.

Incidentally, it is possible to perform the screen composition such that patterns being formed multiple times are formed on the reticle and the illuminating area of the reticle 12 is changed in response to a change of the exposure area of the photosensitive substrate 16.

Figure 2:
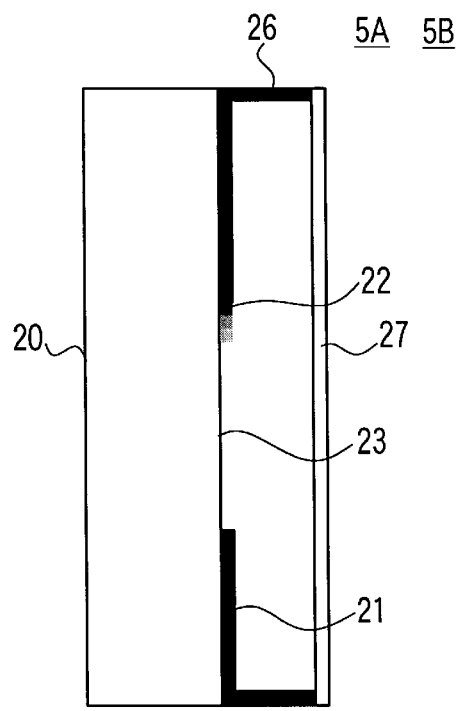
FIG. 2 is a traverse sectional view of a beam shape setting device in accordance with the embodiment.

Like the conventional ones, each of the first blind 6A and second blind 5B is made as shown in FIG. 2 such that chrome is deposited on a transparent glass substrate 20 by vapor deposition so as to form a shade portion 21, an extinction portion 22 and an opening 23. In the present embodiment, a transparent protection member 27 is further provided in proximity to the glass substrate 20 with a gap, which is held by a frame 26, to cover a surface of the glass substrate 20 on which chrome is to be deposited, while a space surrounded by the chrome-deposited surface of the glass substrate 20 and the protection member 27 is shielded from other spaces so that particles will not be adhered to the chrome-deposited surface of the glass substrate 20.

The protection member 27 is made of material which is capable of transmitting the illuminating light 11, which serves as the exposure light, therethrough, so it is possible to use a transparent thin film such as pericline which is related to the reticle. Concretely speaking, it is preferable to use a thin glass or mixture made by mixing nitrocellulose and cellulose derivative other than nitrocellulose, for example. As the cellulose derivative, it is possible to use cellulose acetate, cellulose acetate butyrate, cellulose acetate propionate, ethyl cellulose, carbonate acetyl cellulose, etc. It is desirable to form antireflection layers on both surfaces of the transparent thin film. As the frame 26, it is possible to use metal material or plastics.

Any methods can be employed as formation method of the protection member 27, however, it is preferable to employ spin coating method applied to the smooth flat plate in case of high molecular films which are superior in accuracy of film thickness and surface performance. As conditions for the spin coating, there are provided a number of factors such as viscosity of solution, evaporation rate of solvent, surrounding temperature of spin coator, humidity, spin rotation speed and spinning time, from which conditions should be properly selected.

The protection member 27 having antireflection layers at both surfaces is formed such that at first, an antireflection layer is formed on a flat plate, then, after solvent is sufficiently dried, a transparent thin film layer is formed on it, furthermore, after solvent is sufficiently dried, an antireflection layer is formed on it. The frame 26 made of metal material or plastics, to which a both-side-adhesive tape is attached in the room temperature and in the atmosphere, is adhered to a three-layer film formed on the flat plate. By taking off it, it is possible to obtain the three-layer film of the protection member 27 which covers the frame 26.

Figure 3:
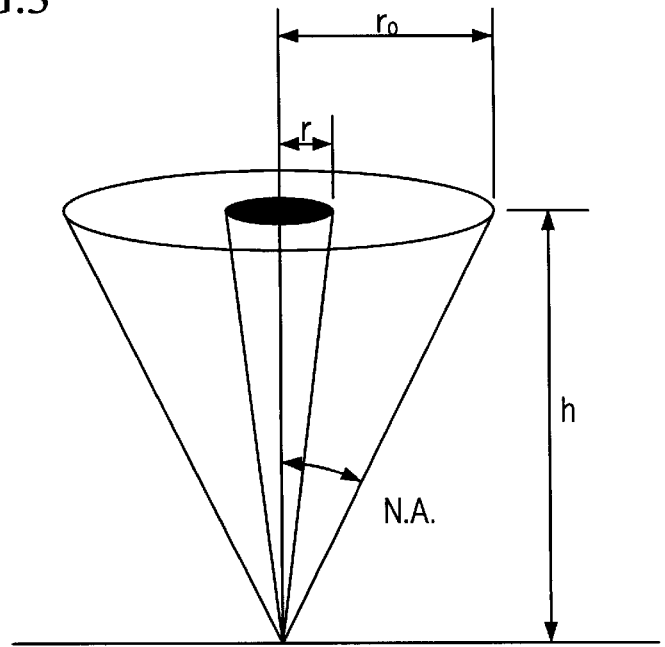
FIG. 3 is a schematic illustration showing relationships between a particle and an illumination optical system.

FIG. 3 is a drawing showing a relationship between the illumination optical system 9 and a particle which is attached to a back surface of the glass substrate 20 or a surface of the protection member 27, wherein if tolerance of illumination uniformity is A[%], the following equations are established.

$$r = (A/100)^{0.5} \times r_0$$
$$= (A/100)^{0.5} \times h \times \tan(\sin^{-1}(N.A.))$$

where r denotes a radius of a particle whose shape is assumed as a circular shape, $r_0$ denotes a radius of illumination flux at a point which is apart from a conjugate point by h in a direction of the optical axis, and N.A. denotes brightness of the illumination system. If the tolerance A[%] of the illumination uniformity is determined, it is possible to determine an optimum combination of N.A. and h in accordance with the above equations. In consideration of the operation such as the driving of the reticle blind 5, it is preferable to set h in a range from five to ten [mm].

As described above, the present embodiment is designed such that within the illumination optical system 9, there are provided two locations, which are optically conjugate with the reticle 12 and at which the first blind 5A and second blind 5B are arranged, so there occurs a room in space before and after the first blind 5A and second blind 5B, therefore, it is possible to provide the blinds 5A, 5B with the frame 26, by which it is possible to form the protection member 27 for protecting the openings 23, 25 and the extinction portions 22, 24 from particles.

Therefore, there is no possibility that particles are attached to the surface of the glass substrate 20 through the openings 23, 25 and extinction portions 22, 24 of the reticle blind 5. Even if particles are attached on the protection member 27 or the back surface of the glass substrate 20, which does not correspond to the location being optically conjugate with the reticle 12, there is no possibility that the particles will be transferred to the photosensitive substrate 16.

Incidentally, the present invention is not limited to the aforementioned embodiment.

The extinction portions 22, 24 can be formed not only by providing a gradient in density of chrome but also by moving the reticle blind 5 during exposure.

The extinction portions 22, 24 are provided to smoothly joint the joints of the patterns of the screen composition together, so they can be omitted by increasing an accuracy of the screen composition.

As the protection member 27, it is possible to use ones, which can cover the transmission portion 23 for transmitting beams but which do not necessarily cover other portions.

The first blind 5A and second blind 5B, arranged at two locations being optically conjugate with the reticle 12 in the illumination optical system 9, are not necessarily equipped with the protection member 27, so by merely arranging the blinds 5A, 5B at the two locations being conjugate with the reticle 12, it is possible to arrange the two blinds 5A, 5B respectively at the locations being perfectly conjugate with the reticle 12, therefore, it is possible to provide an effect to adjust the focus of the two blinds 5A, 5B perfectly.

It is possible to arrange the reticle blind 5 to allow incidence of the illuminating light 11 in any directions. As the illuminating light 11, it is possible to use KrF exima-laser (248 nm), ArF exima-laser (193 nm) and $F_2$ laser (157 nm).

It is possible to employ any types of magnification, such as reduction, equal magnification and enlargement with respect to the projection lens 14. As glass materials for the projection lens 14, quartz or fluorite is used in case of the exima-laser.

As described above, the present invention is designed such that two illuminating area setting means are arranged at two locations being conjugate with the reticle in the exposure device, so it is possible to provide a room in space because the two illuminating area setting means are not necessarily arranged in proximity to each other. For this reason, it is possible to provide a room in space to locate the protection member, which covers the transmission portion for transmitting beams of the beam shape setting device used as the illuminating area setting means. In addition, it is possible to arrange the two illuminating area setting means being apart from each other, so it is possible to provide a room in space to locate a mechanism driving the illuminating area setting means. Because the two illuminating area setting means are located apart from each other, there is no possibility that they come in contact with each other to damage each other.

The present invention is designed such that in the beam shape setting device, there is provided the protection member for covering the transmission portion transmitting beams, so there is no possibility that particles are directly attached to the transmission portion, therefore, even if the particle detector is not used, the particles being attached to the transmission portion do not form shadows in a beam shape which is set.

[Embodiment 2]

Next, embodiment 2 of the present invention will be described with reference to FIGS. 4 to 9.

Figure 5:
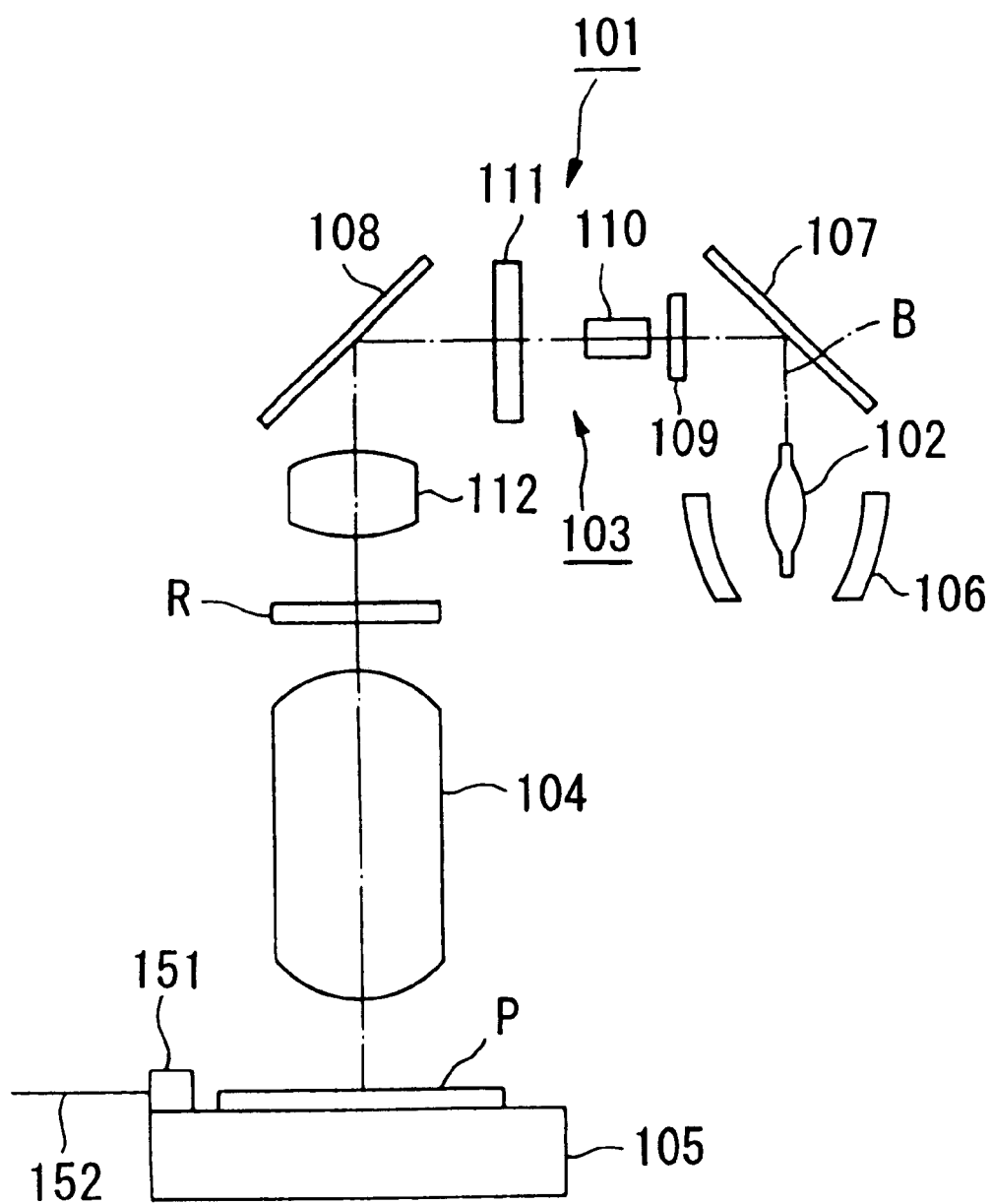
FIG. 5 is a schematic illustration roughly showing a construction of an exposure device which is equipped with the illuminating area setting device.

FIG. 5 is a schematic illustration roughly showing a construction of an exposure device 101 of the embodiment 2. The exposure device 101 projects and transfers a pattern formed on a reticle R onto a photosensitive substrate P, wherein it is constructed by a mercury lamp (light source) 102, an illumination optical system 103, a projection optical system 104 and a substrate stage 105.

The mercury lamp 102 radiates a beam B as illuminating light. This mercury lamp 102 is equipped with an elliptical mirror 106. The elliptical mirror 106 converges the illuminating light radiated from the mercury lamp 102.

The illumination optical system 103 is practically constructed by reflection mirrors 107, 108, a wavelength selecting filter 109, a fly-eye integrator 110, an illuminating area setting device 111 and a lens system 112. The reflection mirror 107 reflects the beam converged by the elliptical mirror 106 in a direction toward the wavelength selecting filter 109. The reflection mirror 108 reflects the beam transmitting through the illuminating area setting device 111 in a direction toward the lens system 112.

The wavelength selecting filter 109 transmits only the wavelengths (g line and i line) required for exposure within the beam B. The fly-eye integrator 110 makes illuminance distribution of the beam B transmitting through the wavelength selecting filter 109 uniform. The lens system 112 forms an image of an illuminating area set by the illuminating area setting device 111 on the reticle R.

Figure 4:
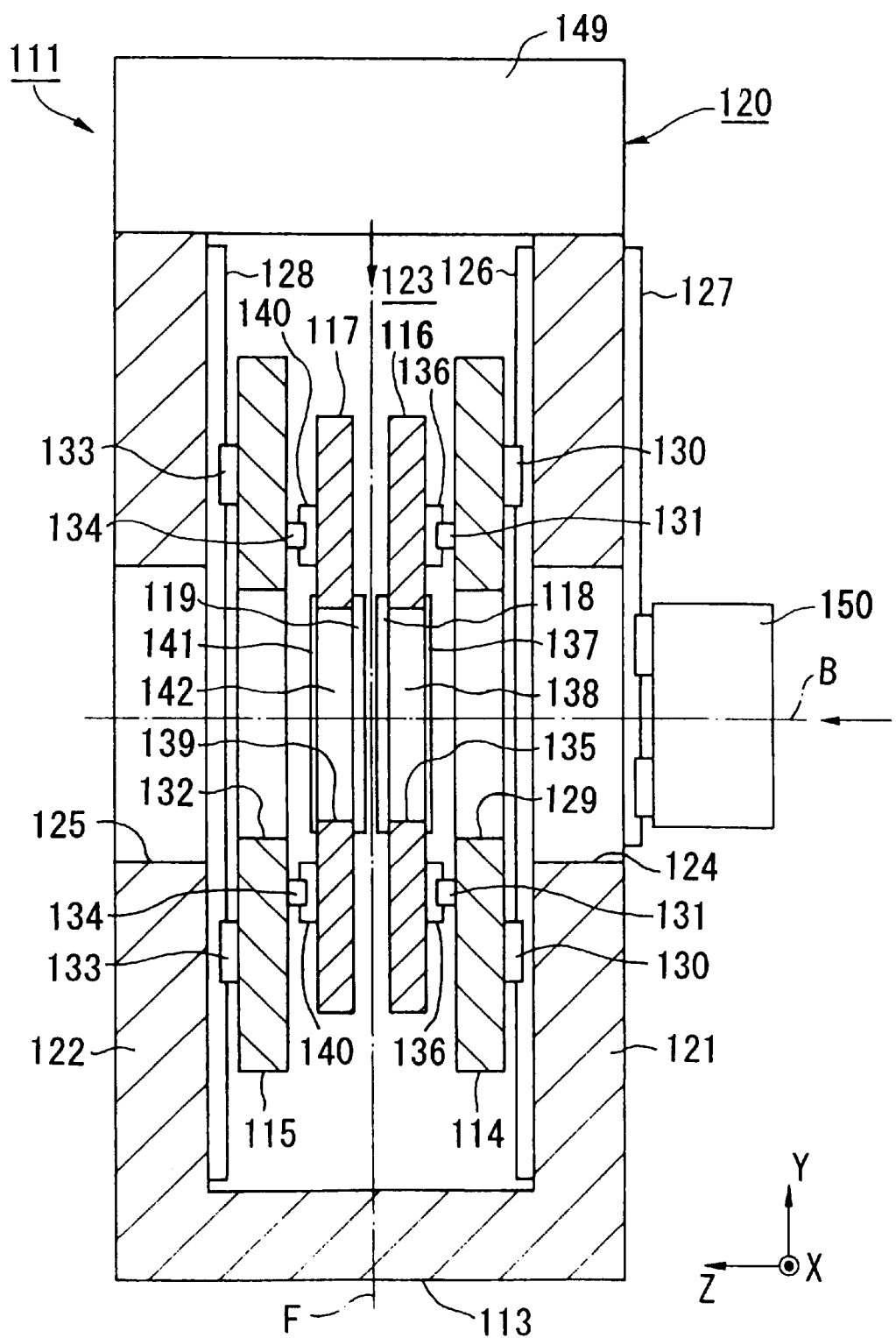
FIG. 4 is a sectional view of an illuminating area setting device which is equipped with cover plates for forming closed spaces at back sides of reticle blinds in accordance with embodiment 2 of the present invention.

The illuminating area setting device 111 sets an area of the reticle R which the beam B transmitting through the fly-eye integrator 110 illuminates, so as shown in FIG. 4, it is mainly constructed by a base 113, intermediate plates 114, 115, holders (holding body) 116, 117, reticle blinds 118, 119 and a foreign matter inspection device 120.

The base 113 has a U-shape in section having opposed walls 121, 122, which are arranged being opposite to each other by a storage space 123 in a direction of the beam B. The storage space stores a unit constructed by the intermediate plate 114, holder 116 and reticle blind 118 and a unit constructed by the intermediate plate 115, holder 117 and reticle blind 119, which are arranged in a symmetrical manner by a conjugate plane F with respect to the reticle R.

Penetration holes 124, 125 through which the beam B penetrates are respectively formed at selected positions of the opposed walls 121, 122. On an interior surface of the opposed wall 121, there are provided a pair of guide rails 126, 126 (only one of which is shown in FIG. 4), which are elongated in a direction of Y axis. On an exterior surface of the opposed wall 121, there are provided a pair of guide rails 127, 127 (only one of which is shown in FIG. 4), which are elongated in the direction of Y axis. On an interior surface of the opposed wall 122, there are also provided a pair of guide rails 128, 128 (only one of which is shown in FIG. 4), which are elongated in the direction of Y axis.

A penetration hole 129 through which the beam B penetrates is formed at a selected position of the intermediate plate 114, which is equipped with a pair of Y-axis guides 130, 130 and a pair of guide rails 131, 131. The Y-axis guides 130, 130 engage with the guide rails 126, 126, along which they are capable of freely moving. The guide rails 131, 131 are attached to a surface of the intermediate plate 114 facing with the holder 116 and are extended in a direction of X axis.

A penetration hole 132 through which the beam B penetrates is formed at a selected position of the intermediate plate 115, which is equipped with a pair of Y-axis guides 133, 133 and a pair of guide rails 134, 134. The Y-axis guides 133, 133 engage with the guide rails 128, 128, along which they are capable of freely moving. The guide rails 134, 134 are attached to a surface of the intermediate plate 115 facing with the holder 117 and are extended in the direction of X axis.

A penetration hole 135 through which the beam B penetrates is formed at a selected position of the holder 116, which is equipped with a pair of X-axis guides 136, 136. The X-axis guides 136, 136 engage with the guide rails 131, 131, along which they are capable of freely moving. In addition, a reticle blind 118 and a cover plate 137 are adhered to and held by the holder 116. The reticle blind 118 is adhered to the holder 116 such that a back surface thereof covers the penetration hole 135 in a side of the conjugate plane F of the holder 116. The cover plate 137 is adhered to the holder 116 such as to cover the penetration hole 135 in a reverse side of the reticle blind 118. A closed space 138 is formed in a back side of the reticle blind 118 by the holder 116 and cover plate 137.

The cover plate 137 is formed by transmission material such as glass which transmits the beam B. In addition, a back surface of the cover plate 137 is set to be separated from the conjugate plane F by a predetermined distance.

A penetration hole 139 through which the beam penetrates is formed at a selected position of the holder 117, which is equipped with a pair of X-axis guides 140, 140. The X-axis guides 140, 140 engage with the guide rails 134, 134, along which they are capable of freely moving. A reticle blind 119 and a cover plate 141 are adhered to and held by the holder 117. The reticle blind 119 is adhered to the holder 117 such that a back surface thereof covers the penetration hole 139 in a side of the conjugate plane F of the holder 117. The cover plate 141 is adhered to the holder 117 such as to cover the penetration hole 139 in a reverse side of the reticle blind 119. A closed space 142 is formed at a back side of the reticle blind 119 by the holder 117 and cover plate 141.

The cover plate 141 is formed by transmission material such as glass which transmits the beam B. In addition, a back surface of the cover plate 141 is set to be separated from the conjugate plane F by a predetermined distance. Separation distances by which the cover plates 137, 141 separate from the conjugate plane F in a direction of the beam B are set based on optical characteristics of the beam B on its optical path, that is, based on the mercury lamp 102, projection optical system 104 and lens system 112 as well as the exposure area of the photosensitive substrate P.

Figure 6:
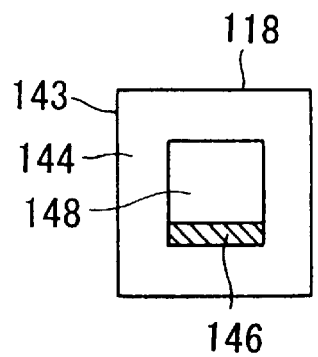
FIG. 6 and FIG. 7 are plan views of reticle blinds which construct the illuminating area setting device of the present invention.
Figure 7:
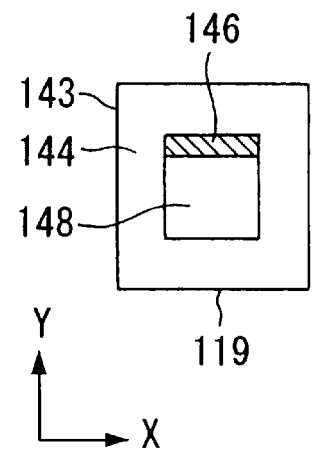

As shown in FIG. 6 and FIG. 7, the reticle blinds 118, 119 are respectively equipped with transparent glass substrates (transmission portions) 143 which transmit the beam B of the illuminating light. Front surfaces of the two glass substrates 143 are arranged opposite to each other by the conjugate plane F and are located in proximity to the conjugate plane F.

On the glass substrate 143, there are provided a shade portion 144, an extinction portion 146 and an opening 148. The shade portion 144 reduces a transmission factor of the beam B so as to allow shade of the beam B, wherein it is formed by vapor deposition in which chrome is deposited on the front surface of the glass substrate 143.

In the extinction portion 146, the chrome is deposited in form of dots, sizes of which are smaller than a resolution limit of the exposure device 101, on the front surface of the glass substrate 143. A density of the dots of a chrome film is set to be gradually increased in a direction from the opening 148 to the shade portion 144, so that an extinction factor of the beam B is gradually varied. The opening 148 has a rectangular shape in plan view on which the chrome is not deposited.

The foreign matter inspection device 120 performs detection as to whether foreign matters (particles) are attached to the surface of the glass substrate 143 or not, wherein it is constructed by an illumination unit 149 and a detector 150. The illumination unit 149 projects detection light such as mercury light along the conjugate plane F between the reticle blinds 118, 119, wherein it is attached to an upper location of the base 113 in the direction of Y axis.

The detector 150 detects scattering light of the detection light which the illumination unit 149 radiates, wherein it is capable of freely moving along the guide rails 127 such that it enters into or escape from the penetration hole 124 of the opposed wall 121.

The projection optical system 104 forms an image of a pattern, which exists in the illuminating area of the reticle R, on the photosensitive substrate P.

The substrate stage 105 holds the photosensitive substrate P, wherein it is capable of freely moving in directions which cross with each other. A moving mirror 151 is mounted on the substrate stage 105. A laser interferometer (not shown) radiates a laser beam 152 to the moving mirror 151, so that a distance between the moving mirror 151 and laser interferometer, i.e., a position of the substrate stage 105, is detected based on interference between the reflected beam and incoming beam.

Within the illuminating area setting device and exposure device which are constructed as described above, a description will be firstly given with respect to operation of the illuminating area setting device below.

In order to perform foreign matter inspection with respect to the reticle blinds 118, 119 before the exposure process, a human operator cuts off the beam B given from the mercury lamp 102 while moving the detector 150 of the foreign matter inspection device 120 along the guide rails 127, so that as shown in FIG. 4, the detector 150 proceeds to a position facing with the penetration hole 124 of the base 113.

Next, the illumination unit 149 projects detection light between the reticle blinds 118, 119. The detector 150 detects scattering light of the detection light. Herein, if foreign matters are attached to surfaces of the glass substrates 143 of the reticle blinds 118, 119, an amount of light of the scattering light changes greatly as compared with the case where the foreign matters are not attached to the surfaces, so it is possible to detect existence of the foreign matters.

If the foreign matters are detected, the holder 116 or the holder 117 is moved along the guide rails 131, 131 or the guide rails 134, 134 in the direction of X axis, so that it projects from the base 113. Thus, it is possible to clean up the glass substrates 143 of the reticle blinds 118, 119.

The aforementioned foreign matter inspection device 120 cannot perform detection with regard to back surfaces of the glass substrates 143, however, there is no possibility that foreign matters are attached to the back surfaces because of the closed spaces 138, 142 formed at back sides of the reticle blinds 118, 119. In addition, the foreign matter inspection device 120 cannot detect foreign matters being attached to the cover plates 137, 141, however, there is no possibility that images of the foreign matters attached to the aforementioned cover plates 137, 141 are formed on the photosensitive substrate P and are being transferred because the cover plates 137, 141 are positioned apart from each other with respect to the conjugate plane F in the direction of the beam B based on optical characteristics of its optical path.

For example, in the exposure device 101 having the aforementioned construction, if a distance between the back surfaces of the cover plates 137, 141 (which are reverse to surfaces located in a side of the conjugate plane F) and the conjugate plane F in the direction of the beam B is 3.5 mm, diameters of the foreign matters which cause nonuniformity of illuminance of 3% or more on the photosensitive substrate P are about 1.1 mm. Normally, the exposure device 101 is located in a clean room, so there is almost no possibility that foreign matters whose diameters are greater than the above are attached to the cover plates. Therefore, by arranging the cover plates 137, 141 being apart from each other with respect to the conjugate plane F by a distance based on the optical characteristics of the optical path, images of the foreign matters attached to the cover plates 137, 141 are not transferred to the photosensitive substrate P.

After completion of the foreign matter inspection, the human operator stops radiation of the detection light from the illumination unit 149 while moving the detector 150 along the guide rails 127, so that the detector 150 escapes from the position facing with the penetration hole 124.

Next, a description will be given with respect to procedures in setting the illuminating area of the beam B by the illuminating area setting device 111. Incidentally, the setting of the illuminating area is disclosed by the official paper of Japanese Patent Application, First Publication No. Hei 7-235466 (which corresponds to U.S. patent application Ser. No. 391,588 filed on Feb. 21, 1995), wherein the description of U.S. patent application Ser. No. 391,588 is incorporated herein as a part of the description of the present specification.

Figure 8:
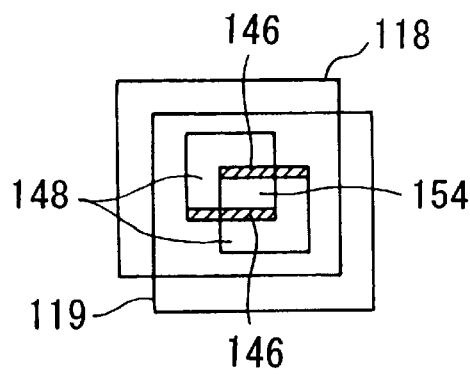
FIG. 8 is a schematic illustration for explaining procedures in formation of an opening by the reticle blinds.

At first, for example, when the intermediate plates 114, 115 and the holder 116, 117 are respectively moved so that the reticle blinds 118, 119 are set in positions as shown in FIG. 8, there is formed an opening 153 whose upper and lower sides match with the extinction portions 146.

Figure 9:
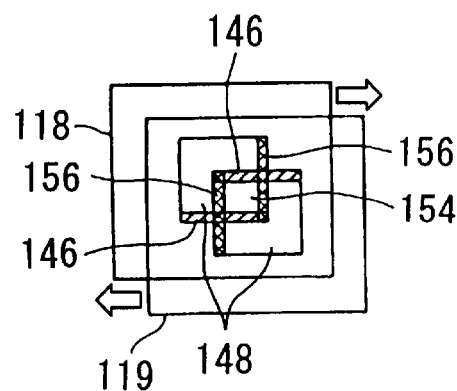
FIG. 9 is a schematic illustration for explaining procedures in formation of an opening by the reticle blinds.
Figure 10A:
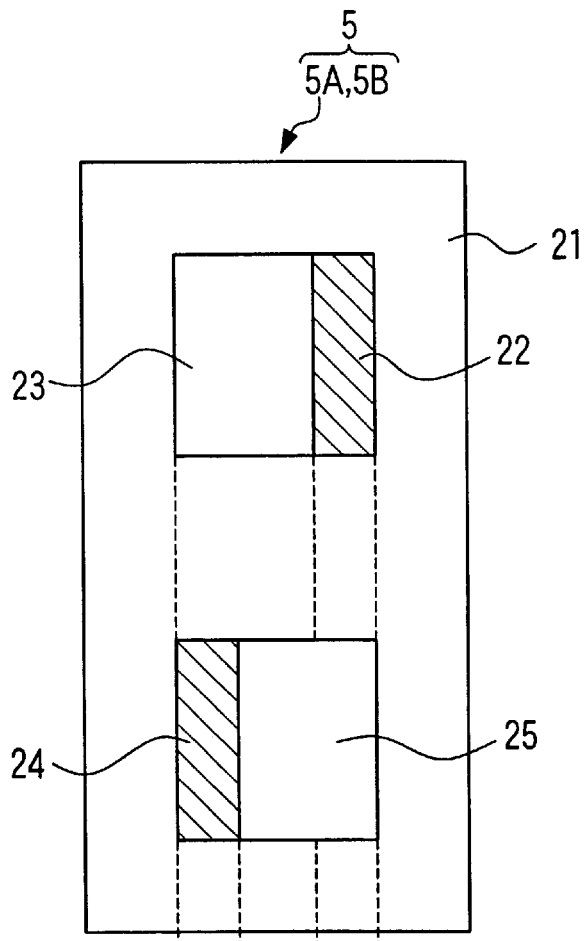
FIGS. 10A–C contain schematic illustration and graphs for explaining the conventional beam shape setting device and its extinction characteristics.
Figure 10B:
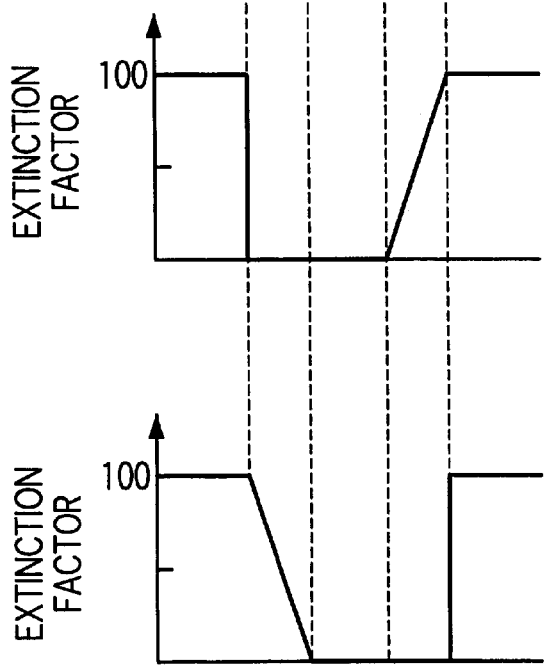
Figure 10C:
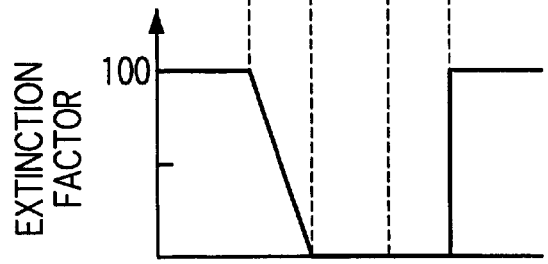

In addition, when the holders 116, 117 are driven in the state of FIG. 8 during the exposure so that the reticle blind 118 is moved in +X direction while the reticle blind 119 is moved in −X direction, as shown in FIG. 9, extinction areas corresponding to the extinction portions 156 are respectively formed at a right side of the opening 148 of the reticle blind 118 and a left side of the opening 148 of the reticle blind 119.

As described above, by the prescribed positions of the extinction portions of the reticle blinds and the prescribed movements of the reticle blinds, it is possible to form the extinction areas at sides of the illuminating area being arbitrarily selected. Incidentally, as disclosed by the official paper of Japanese Patent Application, First Publication No. Hei 7-235466, the reticle blinds can be equipped with multiple openings, which differ from each other in positions of the extinction portions and which are selected and used according to needs.

The illuminating area set by the reticle blinds 118, 119 is set such that adjoining unit areas overlap with each other with respect to the extinction areas. Thus, even if the overlapping errors and line width differences occur due to the screen composition, they gradually change so that joints shade off and joints become unrecognizable by human eyes, therefore, it is possible to avoid an event in which joints of patterns become invisible.

Incidentally, sides of the illuminating areas which do not adjoin other illuminating areas are subjected to masking by a shade band of the reticle.

In the exposure device 101 equipped with the aforementioned illuminating area setting device 111, the beam B which is illumination light of the mercury lamp 102 is converged on the elliptical mirror 106 and is reflected by the reflection mirror 107, so that it is incident on the wavelength selecting filter 109. The wavelength selecting filter 109 transmits only the wavelengths of the beam B which are required for the exposure, so that the transmitted beam B is subjected to the fly-eye integrator 110 to establish a uniform illuminance distribution and is then supplied to the illumination area setting device 111.

The beam B which transmits through the opening set by the illuminating area setting device 111 is reflected by the reflection mirror 108 and is then incident on the lens system 112. This lens system 112 forms an image of the opening set by the reticle blinds 118, 119 on the reticle R, an illuminating area of which is illuminated. An image of a pattern of the reticle R, which exists in the illuminating area, is formed on the photosensitive substrate P by the projection optical system 104, thus, the unit area of the photosensitive substrate P is exposed to light. Incidentally, the photosensitive substrate P corresponds to the wafer in case of the manufacturing process of the semiconductor integrated circuits, while it corresponds to the glass plate in case of the manufacturing process of the liquid crystal display components.

After completion the exposure one time, the reticle R is replaced with new one while the substrate stage 105 is driven and is set in position being detected by the laser interferometer in such a way that another unit area of the photosensitive substrate P coincides with an exposure area of a next time. In addition, an opening corresponding to such unit area is set by the illuminating area setting device 111. Thereafter, similar procedures are repeated every time the exposure is completed, so that the overall area of the photosensitive substrate P is exposed to light.

According to the illuminating area setting device of the present embodiment, the foreign matter inspection device 120 is capable of detecting foreign matters being attached to surfaces of the glass substrates 143 of the reticle blinds 118, 119, while it is possible to avoid an event that foreign matters are attached to back surfaces of the glass substrates 143 because of the closed spaces 138, 142 which are formed by the holders 116, 117 and the cover plates 137, 141 in back sides of the glass substrates. For this reason, cleaning operations are required for only the front surfaces of the glass substrates to which foreign matters are being attached, so it is possible to actualize reduction in maintence time.

The illuminating area setting device of the present embodiment uses the two glass substrates 143 which are arranged with respect to the conjugate plane F, wherein the back sides of the glass substrates are related to the closed spaces 138, 142 being formed by the cover plate 137, 141, so it is possible to prevent foreign matters from being attached to the back surfaces of the glass substrates 143.

The exposure device of the present embodiment is designed such that foreign matters are not attached to both surfaces of the reticle blinds 118, 119 which are located in proximity to the conjugate plane F of the reticle R, so it is possible to transfer a pattern formed on the reticle R onto the photosensitive substrate P in accordance with the prescribed procedures. In addition, the exposure device of the present embodiment is designed such that the cover plates 137, 141 are located apart from each other by a distance based on the optical characteristics on the optical path of the beam B, so even if foreign matters are attached to the cover plates 137, 141 forming the aforementioned closed spaces 138, 142, it is possible to avoid causing the nonuniformity of illuminance, which causes a problem, on the photosensitive substrate P while it is possible to prevent images of the foreign matters from being transferred onto the photosensitive substrate P, so that it is possible to accurately transfer a predetermined pattern, formed on the reticle R, onto the photosensitive substrate P.

Further, only the front surfaces of the glass substrates have a possibility that foreign matters are being attached thereto, so it is possible to reduce fraction defective of the photosensitive substrate P, due to the foreign matters being attached, by half.

If parameters constructing the aforementioned optical characteristics are changed, it is possible to adequately set a separation distance between the conjugate plane F and cover plate(s) on the basis of sizes of foreign matters being expected.

Incidentally, the present embodiment is described such that the foreign matter inspection device 120 constructs a part of the illuminating area setting device 111, however, this invention is not limited to such embodiment, so it is possible to provide the foreign matter inspection device 120 being externally of the illuminating area setting device 111. In addition, the present embodiment is constructed such that the detector 150 of the foreign matter inspection device 120 is connected to the opposed wall 121 of the base 113, however, it can be reconstructed such that the detector is connected to the opposed wall 122.

It is possible to adequately combine constructions of the embodiments 1, 2 together.

The embodiment 2 is constructed such that the reticle R is replaced with new one with respect to each unit area on the photosensitive substrate P, however, the present invention is not limited to such embodiment, so it can be reconstructed such that patterns being formed multiple times are formed on the reticle R in advance, for example, then, an illuminating area of the reticle R is changed in response to a change of an exposure area of the photosensitive substrate P.

In order to prevent vibrations, which occur when the reticle blinds 118, 119 are driven, from being transmitted to the projection optical system 104, the illuminating area setting device 111 should be arranged independently of members holding the projection optical system 104 with respect to the vibrations.

Incidentally, it is possible to apply this invention to exposure devices of a step-and-repeat type, in which a pattern of the reticle is exposed to light under the condition where the reticle and wafer stand still, then, the wafer is moved by steps sequentially, or exposure devices of a scanning type in which the reticle and wafer are moved synchronously so that a pattern of the reticle is exposed to light.

It is unnecessary to limit kinds of the exposure devices, applicable to this invention, to exposure devices used for manufacturing semiconductor devices, so this invention is widely applied to exposure devices such as exposure devices used for manufacturing liquid crystal devices, in which liquid crystal display component patterns are exposed to light and are formed on glass plates of a rectangular shape, and exposure devices used for manufacturing thin-film magnetic heads, for example. For example, recently, liquid crystal display substrates enabling thin formation of devices are frequently used for manufacturing display components of personal computers and television receivers, wherein the liquid crystal display substrates of this type are manufactured such that transparent thin-film electrodes are subjected to patterning in desired shapes on photosensitive substrates having rectangular shapes in plan view in accordance with the photolithography method. The exposure device of the present invention is capable of serving as photolithography devices and is used in fields in which patterns formed on the reticle are exposed to light and are formed in the photoresist layer on the photosensitive substrates by means of the projection optical system.

The light source of the illumination optical system is not necessarily limited to bright lines (g line, i line) produced by the mercury lamp, so it is possible to use KrF exima-laser (248 nm), ArF exima-lase (193 nm) and $F_2$ laser (157 nm).

In addition, magnification of the projection optical system 4 is not necessarily limited to reduction, but it is possible to employ equal magnification and enlargement.

If far ultraviolet radiation such as the exima-laser is used, materials such as the quartz and fluorite which have transmission of the far ultraviolet radiation are used as glass materials for the projection optical system.

If linear motors are used to drive the reticle stage and substrate stage, it is possible to use linear motors of an air floating type using air bearings and linear motors of a magnetic floating type using Lorenz's force or reactance force.

As the stages, it is possible to use stages of a type which move along guides and stages of a guide-less type which do not use guides.

In this case, in order to prevent reaction force, which is caused to occur due to movement of the substrate stage, from being transmitted to the projection optical system, it is possible to reconstruct the device using a frame member by which the reaction force is released mechanically to the floor (or ground). In order to prevent reaction force, which is caused to occur due to movement of the reticle stage, from being transmitted to the projection optical system, it is possible to reconstruct the device using a frame member by which the reaction force is released mechanically to the floor (or ground).

Incidentally, the exposure device of the present embodiment(s) can be manufactured in such a way that the illumination optical system and projection optical system, each constructed by multiple lenses, are built in the main body of the exposure device and are subjected to optical adjustments; the illuminating area setting device 111 equipped with the cover plates 137, 141 is arranged inside of the illumination optical system; the main body of the exposure device is equipped with the reticle stage and substrate stage each constructed by a number of mechanical parts and is subjected to wiring and pipe arrangement; lastly, overall adjustments (electric adjustments, operation conformation, etc.) is performed. It is preferable to manufacture the exposure device in the clean room in which temperature and cleanness are managed.

Semiconductor devices are manufactured in accordance with a series of steps such for designing functions and performance of devices, a step for manufacturing reticles based on the design step, a step for manufacturing a wafer from silicon materials, a step for forming patterns of the reticles on the wafers on exposure to light by the exposure device of the aforementioned embodiment(s), a step for assembling the devices (which includes dicing process, bonding process and packaging process), an inspection step, etc.

What is claimed is:

1. A manufacturing method of an exposure device which is used to form a pattern of a mask on a substrate on exposure to light using exposure light radiated from a light source, said manufacturing method comprising the steps of:

arranging an illumination optical system which illuminates the mask between the light source and the mask;

arranging an illuminating area setting device which regulates an illuminating area of the mask within the illumination optical system; and arranging a transmission member, which transmits the exposure light therethrough and prevents foreign matter from attaching to the illuminating area setting device, in the illuminating area setting device.

2. A manufacturing method according to claim 1, wherein the illuminating area setting device has an extinction portion for extinction of the exposure light.

3. A manufacturing method according to claim 1, wherein the illuminating area setting device comprises a pair of illuminating area setting members which are arranged being opposed to each other.

4. A manufacturing method according to claim 1, further comprising:

arranging an inspection device that is capable of detecting a foreign particle that is attached to the illuminating area setting device.

5. A manufacturing method according to claim 1, wherein the exposure device exposes the pattern by overlapping transfer of the pattern onto the substrate.

6. A manufacturing method of an exposure device which is used to form a pattern of a mask on a substrate on exposure to light using exposure light radiated from a light source, said manufacturing method comprising the steps of:

arranging an illumination optical system which illuminates the mask between the light source and the mask;

arranging an illuminating area setting device which regulates an illuminating area of the mask within the illumination optical system;

arranging a transmission member which transmits the exposure light therethrough in the illuminating area setting device; and arranging an inspection device which is capable of detecting a foreign particle attached to the illuminating area setting device, wherein the inspection device comprises a light emitting device that emits a detection beam, and a light detection device that detects the detection beam.

7. A manufacturing method according to claim 6, further comprising:

providing a driver that drives the light detection device between an on-position that is capable of detecting the detection beam and an off-position that is not capable of detecting the detection beam.

* * * * *